United States Patent
Ebisu et al.

(10) Patent No.: US 10,230,008 B2
(45) Date of Patent: Mar. 12, 2019

(54) SEMICONDUCTOR LIGHT RECEIVING DEVICE, OPTICAL RECEIVER MODULE AND MANUFACTURING METHOD THEREOF

(71) Applicant: Oclaro Japan, Inc., Kanagawa OT (JP)

(72) Inventors: Masahiro Ebisu, Kanagawa (JP); Hiroshi Hamada, Tokyo (JP); Yasushi Sakuma, Tokyo (JP); Shigenori Hayakawa, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/042,655

(22) Filed: Feb. 12, 2016

(65) Prior Publication Data

US 2016/0240698 A1   Aug. 18, 2016

(30) Foreign Application Priority Data

Feb. 18, 2015   (JP) .................................. 2015-029677

(51) Int. Cl.
*H01L 31/02*       (2006.01)
*H01L 31/18*       (2006.01)
*H01L 31/0203*   (2014.01)
*H01L 31/0352*   (2006.01)
(Continued)

(52) U.S. Cl.
CPC .... *H01L 31/0203* (2013.01); *H01L 31/02325* (2013.01); *H01L 31/035281* (2013.01); *H01L 31/1035* (2013.01); *H01L 31/1844* (2013.01); *Y02E 10/544* (2013.01); *Y02P 70/521* (2015.11)

(58) Field of Classification Search
CPC ............................................... H01L 31/035281
See application file for complete search history.

(56) References Cited

U.S. PATENT DOCUMENTS 5,260,588 A * 11/1993 Ohta ..................... H01L 27/153
                                                                257/623
5,723,360 A *  3/1998 Iwasaki ............. H01L 21/30612
                                                                117/93
(Continued)

FOREIGN PATENT DOCUMENTS

| JP | 9-83077 A | 3/1997 |
| JP | 2008-270529 A | 11/2008 |
| JP | 2010-278406 A | 12/2010 |

OTHER PUBLICATIONS

Japanese Office Action received in corresponding Japanese Application No. 2015-029677 dated Oct. 30, 2018 with partial translation.

*Primary Examiner* — Matthew L Reames
(74) *Attorney, Agent, or Firm* — Mattingly & Malur, PC

(57) ABSTRACT

Provided are a semiconductor light receiving device, an optical receiver module, and a manufacturing method thereof in which characteristics of the device are improved when the device has a structure in which a mesa structure including layers formed of a common material is buried by a buried layer. The semiconductor light receiving device includes the mesa structure including the layers formed of a commonmaterial, the layers including an absorbing layer, the mesa structure being buried by the buried layer formed so as to surround side surfaces of the mesa structure. The mesa structure has a cross section having a forwardly tapered portion and a reversely tapered portion.

17 Claims, 12 Drawing Sheets

(51) Int. Cl.
*H01L 31/0232* (2014.01)
*H01L 31/103* (2006.01)

(56) References Cited

U.S. PATENT DOCUMENTS

| | | | |
|---|---|---|---|
| 2001/0026672 A1* | 10/2001 | Kinoshita | G02B 6/122 |
| | | | 385/131 |
| 2002/0096685 A1* | 7/2002 | Yabusaki | H01S 5/0425 |
| | | | 257/79 |
| 2003/0218226 A1* | 11/2003 | Ito | H01L 31/107 |
| | | | 257/431 |
| 2005/0259708 A1* | 11/2005 | Park | H01S 5/026 |
| | | | 372/50.21 |
| 2006/0043518 A1* | 3/2006 | Nakaji | G02B 6/122 |
| | | | 257/458 |
| 2008/0265357 A1 | 10/2008 | Toyonaka et al. | |
| 2009/0321868 A1* | 12/2009 | Nakaji | H01L 31/105 |
| | | | 257/458 |

* cited by examiner

SEMICONDUCTOR LIGHT RECEIVING DEVICE, OPTICAL RECEIVER MODULE AND MANUFACTURING METHOD THEREOF

CROSS-REFERENCE TO RELATED APPLICATION

The present application claims priority from Japanese application JP 2015-029677, filed on Feb. 18, 2015, the content of which is hereby incorporated by reference into this application.

BACKGROUND OF THE INVENTION

1. Field of the Invention

The present invention relates to a semiconductor light receiving device, an optical receiver module, and manufacturing methods thereof.

2. Description of the Related Art

There is known a semiconductor light receiving device having a mesa structure buried by a buried layer. With the mesa structure buried by the buried layer, the reliability of the device is improved. For example, in JP 2008-270529 A and JP 2010-278406 A, there are disclosed back-illuminated avalanche photodiodes. In the back-illuminated avalanche photodiode disclosed in JP 2008-270529 A, a first mesa 110 including a p-type InGaAs light-absorbing layer 106 and a p-type InAlGaAs cap layer 107 is formed, and the first mesa 110 is buried by a buried layer 111 formed of a p-type InP crystal. Further, in the back-illuminated avalanche photodiode disclosed in JP 2010-278406 A, a first mesa structure 208 including a p-type InAlAs electric field adjusting layer 204c, a p-type InGaAs light-absorbing layer 205, a p-type InAlGaAs cap layer 206, and a p-type InGaAs contact layer 207 is formed, and the first mesa structure 208 is buried by a buried layer 209 formed of a Fe-doped InP crystal.

SUMMARY OF THE INVENTION

In recent years, costs for a semiconductor light receiving device are desired to be reduced. In order to attain this, it is desired to form a mesa structure including a light-absorbing layer in a simpler step. Therefore, it is desired that semiconductor layers forming the mesa structure be formed of a common semiconductor material.

A mesa structure is formed through formation of a mask on an upper surface of semiconductor layers and through etching using the mask. In the back-illuminated avalanche photodiodes disclosed in JP 2008-270529 A and JP 2010-278406 A, the mesa structure has a forwardly tapered shape. However, when the semiconductor layers are formed of a common semiconductor material, the mesa structure formed has a reversely tapered shape in a cross section including a lamination direction. A forwardly tapered shape as used herein means a shape in which a width of the semiconductor layers reduces from a substrate side along the lamination direction, and a reversely tapered shape as used herein means a shape in which the width of the semiconductor layers increases from the substrate side along the lamination direction.

Inventors of the present invention manufactured a semiconductor light receiving device through burying a mesa structure having a reversely tapered shape by a buried layer, and reviewed the manufactured semiconductor light receiving device. As a result, the inventors of the present invention found that, due to the reversely tapered shape of the mesa structure, burying growth of the buried layer does not occur normally, thereby deteriorating characteristics of the device.

The present invention has been made in view of the problem described above, and it is an object of the present invention to provide a semiconductor light receiving device, an optical receiver module, and manufacturing methods thereof in which characteristics of the device are improved when the device has a structure in which a mesa structure including layers formed of a common material is buried by a buried layer.

(1) In order to solve the problem described above, according to one embodiment of the present invention, there is provided a semiconductor light receiving device, including: a mesa structure including layers formed of a common material, the layers including an absorbing layer, and a buried layer configured to bury therein the mesa structure so as to surround side surfaces of the mesa structure. The mesa structure has a cross section including a forwardly tapered portion and a reversely tapered portion.

(2) In the semiconductor light receiving device described in the above-mentioned item (1), a material forming the mesa structure may be InGaAs.

(3) According to one embodiment of the present invention, there is provided an optical receiver module, including: the semiconductor light receiving device described in the above-mentioned item (1) or (2), and a submount configured to mount thereon the semiconductor light receiving device. In the optical receiver module, the semiconductor light receiving device may include thereon a p-side electrode and an n-side electrode on the submount side, the submount may include thereon a P electrode pattern and an N electrode pattern on the semiconductor light receiving device side, and the p-side electrode may be electrically connected to the P electrode pattern and the n-side electrode may be electrically connected to the N electrode pattern.

(4) According to one embodiment of the present invention, there is provided a method of manufacturing a semiconductor light receiving device, which may include: a first etching step of forming a first mask on an upper surface of a semiconductor multilayer including layers formed of a common material and performing etching using the first mask to form a first mesa; a second mask forming step of forming a second mask, the second mask having a shape smaller than a shape of the first mask; a second etching step of etching side surfaces of the first mesa using the second mask to form a second mesa; and a burying growth step of performing burying growth of a buried layer using the second mask so that the buried layer surrounds the second mesa.

(5) In the method of manufacturing a semiconductor light receiving device described in the above-mentioned item (4), the second mask forming step may include etching the first mask to form the second mask.

(6) In the method of manufacturing a semiconductor light receiving device described in the above-mentioned item (5), a shape of the second mask formed in the second mask forming step may be smaller than a shape of the first mask.

(7) In the method of manufacturing a semiconductor light receiving device described in any one of the above-mentioned items (4) to (6), a shape of the second mask formed in the second mask forming step may be equal to or smaller than a shape of an upper surface of the first mesa formed in the first etching step.

According to the one embodiment of the present invention, there may be provided the semiconductor light receiving device, the optical receiver module, and the manufacturing method thereof in which characteristics of the device are improved when the device has the structure in which the mesa structure including the layers formed of the common material is buried by the buried layer.

DETAILED DESCRIPTION OF THE INVENTION

Figure 1:
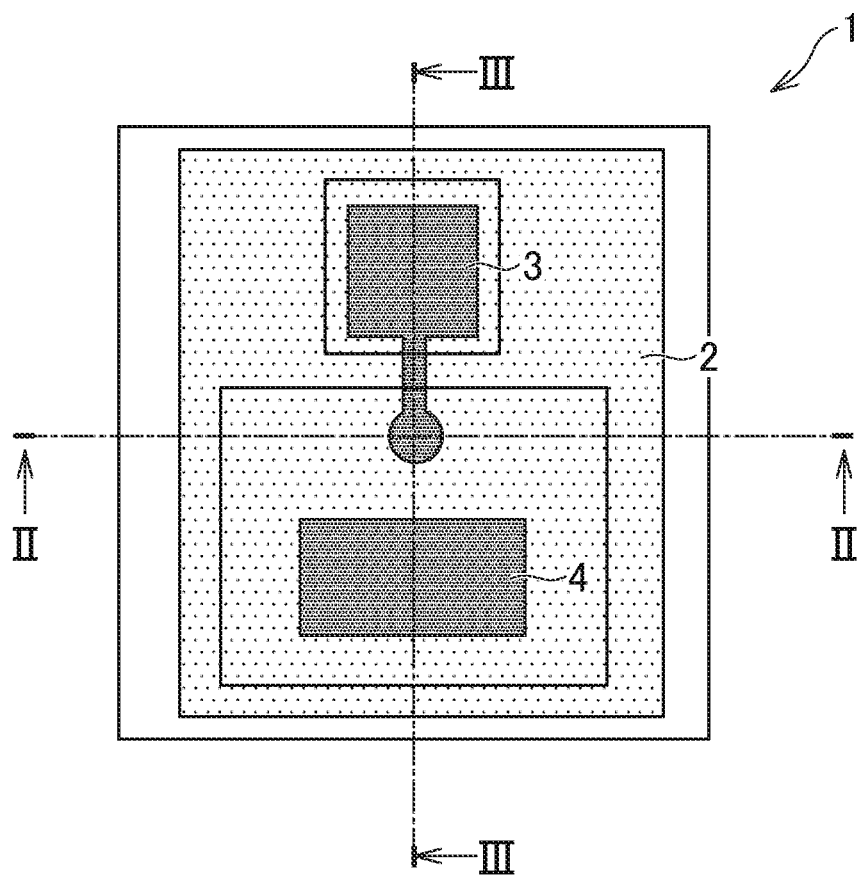
FIG. 1 is a plan view of a semiconductor light receiving device according to an embodiment of the present invention.

An embodiment of the present invention is specifically described in detail in the following with reference to the attached drawings. Note that, throughout the figures for illustrating the embodiment, like reference numerals are used to represent members having like functions, and repetitive description thereof is omitted. Note that, the drawings referred to in the following are only for illustrating the embodiment by way of an example, and are not necessarily drawn to scale.

Figure 2:
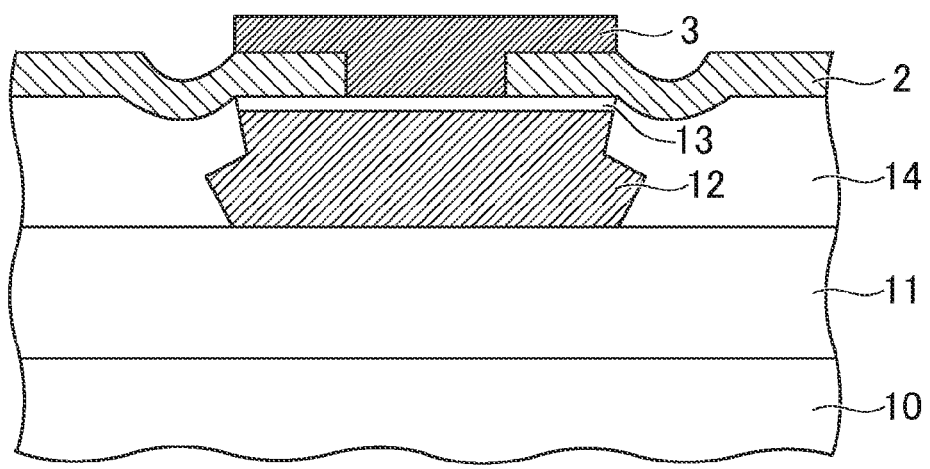
FIG. 2 is a sectional view of the semiconductor light receiving device according to the embodiment of the present invention.
Figure 3:
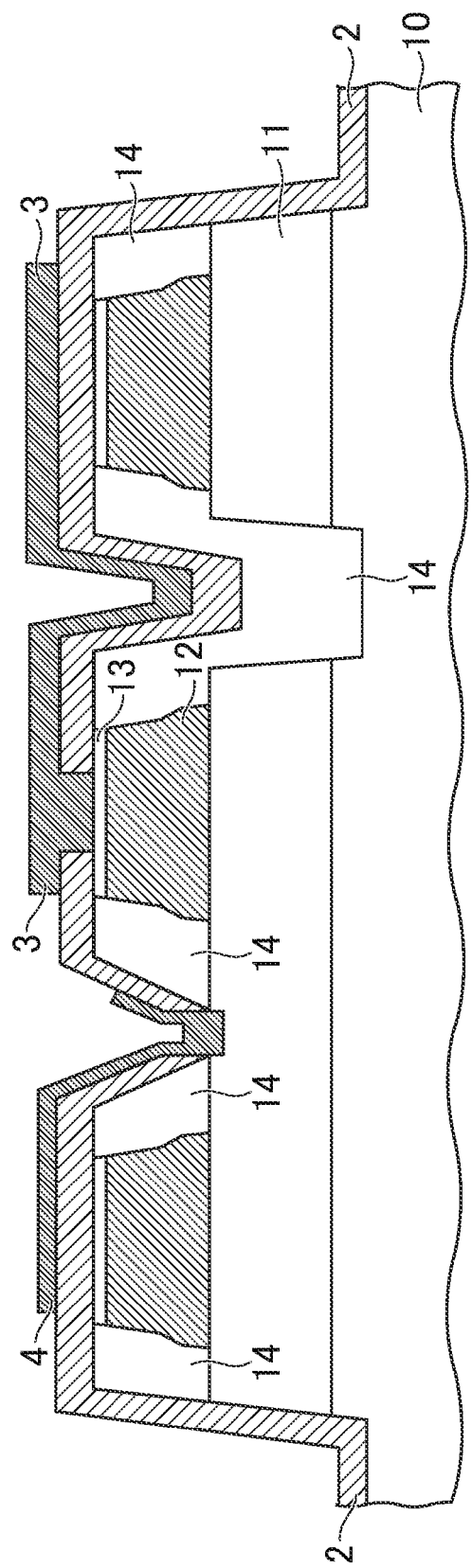
FIG. 3 is a sectional view of the semiconductor light receiving device according to the embodiment of the present invention.

FIG. 1 is a plan view of a semiconductor light receiving device 1 according to an embodiment of the present invention. FIG. 2 is a sectional view of the semiconductor light receiving device 1 according to the embodiment taken along the line II-II of FIG. 1. FIG. 3 is a sectional view of the semiconductor light receiving device 1 taken along the line III-III of FIG. 1.

The semiconductor light receiving device 1 according to this embodiment is a photodiode (PD) and is a back-illuminated light receiving device. Received light that enters from a back surface of the device is absorbed by a light-absorbing layer, to thereby generate a photocurrent, and the photocurrent is converted to an electric signal. As illustrated in FIG. 1, the semiconductor light receiving device 1 according to this embodiment includes a protective film 2 (passivation film) formed on a surface thereof, and a p-side electrode 3 and an n-side electrode 4 further formed thereon.

As illustrated in FIG. 2, the semiconductor light receiving device 1 according to this embodiment has a mesa structure (light receiving mesa structure). An n-type InP contact layer 11 is formed on a Fe-doped InP substrate 10, and the mesa structure (light receiving mesa structure) including an InGaAs light-absorbing layer 12 and a p-type InGaAs contact layer 13 is formed on the n-type InP contact layer 11. The mesa structure includes layers formed of InGaAs, which is a common material. In this case, the InGaAs light-absorbing layer 12 is a non-doped layer (intrinsic semiconductor layer) to which, intentionally, no impurity is added, while the p-type InGaAs contact layer 13 is a p-type semiconductor layer to which an appropriate p-type dopant is added. The mesa structure is buried by a Fe-doped InP buried layer 14 that is formed so as to surround side surfaces of the mesa structure. It is desired that a buried layer be semi-insulating so as to inhibit a dark current that flows therethrough even when no light is received, and thus, according to this embodiment, Fe is added as a dopant. The protective film 2 (passivation film) is formed so as to cover the mesa structure. A circular opening (region in which the protective film 2 is not formed) is formed on an upper surface of the mesa structure (on an upper surface of the p-type InGaAs contact layer 13), and the p-side electrode 3 is formed so as to be in contact with the p-type InGaAs contact layer 13 in the opening.

The mesa structure of the semiconductor light receiving device 1 according to this embodiment includes the InGaAs light-absorbing layer 12 and the p-type InGaAs contact layer 13 that are formed of InGaAs, which is a common material. The expression "formed of a common material" as used herein means that a material forming a base of the semiconductor layers is in common (the same), and does not mean that impurities (dopant) added to (the base of) the semiconductor layers is the same. In other words, as materials included in a semiconductor layer, a compound semiconductor serving as the base and impurities (dopant) are clearly distinguished from each other, and the expression "formed of a common material" means that the compound semiconductor serving as the base is in common. According to the present invention, a material forming the base of the semiconductor layers is a III-V compound. According to this embodiment, a material forming the base of the light receiving mesa structure is InGaAs. The expression "a common material is InGaAs" as used herein means that In (indium) and Ga (gallium) are used as group III elements and As (arsenic) is used as a group V element. In other words, InGaAs is a compound expressed as $In_xGa_{1-x}As$ (0<x<1). Both the InGaAs light-absorbing layer 12 and the p-type InGaAs contact layer 13 that form the mesa structure are formed of InGaAs as the common material, but the value of x may be different between the two layers. The same can be said with regard to a case in which a plurality of group V elements are contained. Further, when an expression "InGaAs" is used, a compound semiconductor formed of a ternary compound is referred to, and a case in which only any one of the two group III elements (In and Ga) is included (x=0 or x=1) is excluded. The same can be said with regard to a case in which a plurality of group V elements are contained. Note that, according to this embodiment, the material forming the mesa structure is InGaAs, but the present invention is not limited thereto and the mesa structure may be formed of other materials.

As described above, the semiconductor light receiving device 1 according to this embodiment includes the p-side electrode 3 and the n-side electrode 4 on the surface of the device, and portions of the p-side electrode 3 and the n-side electrode 4, respectively, connected to the outside (hereinafter referred to as junctions) are formed so as to be the same in level with a portion of the p-side electrode 3 formed on the upper surface of the mesa structure. As illustrated in FIG. 3, dummy mesa structures formed in the same step as the forming step of the mesa structure are formed under the junction of the p-side electrode 3 and under the junction of the n-side electrode 4, respectively. The dummy mesa structures are buried by the Fe-doped InP buried layer 14 in the same way as the mesa structure, and the protective film 2 is formed on upper surfaces of the dummy mesa structures. The p-side electrode 3 is shaped so as to extend from the junction thereof to the upper surface of the mesa structure to be electrically connected to the upper surface of the mesa structure. The protective film 2 covers a surface of the n-type InP contact layer 11 (regions in which the mesa structure and the dummy mesa structures are not formed and which are not buried by the Fe-doped InP buried layer 14), and an opening is formed in part of the protective film 2. The n-side electrode 4 extends from the junction thereof to the opening to be electrically connected to the n-type InP contact layer 11.

Main features of the semiconductor light receiving device according to the present invention are that the mesa structure including the absorbing layer is buried by the buried layer, the mesa structure includes the layers formed of a common material, and the mesa structure has across section having a forwardly tapered portion and a reversely tapered portion. In this case, the cross section is shaped to have a plurality of stair-steps. According to this embodiment, the cross section is a cross section of the mesa structure illustrated in FIG. 2, and the cross section has a reversely tapered portion, a forwardly tapered portion, and a reversely tapered portion in this order from the substrate side along a lamination direction. The mesa structure of the semiconductor light receiving device according to the present invention realizes a semiconductor light receiving device with improved characteristics.

Note that, the mesa structure of the semiconductor light receiving device according to the present invention has a cross section that is shaped to have a plurality of stair-steps, but in reality, there may be cases in which a boundary between a reversely tapered portion and a forwardly tapered portion is obscure. Even in such cases, it is enough that the mesa structure is formed not in a single etching step but in a plurality of etching steps and that a cross section of the mesa structure has a reversely tapered portion and a forwardly tapered portion.

Figure 4:
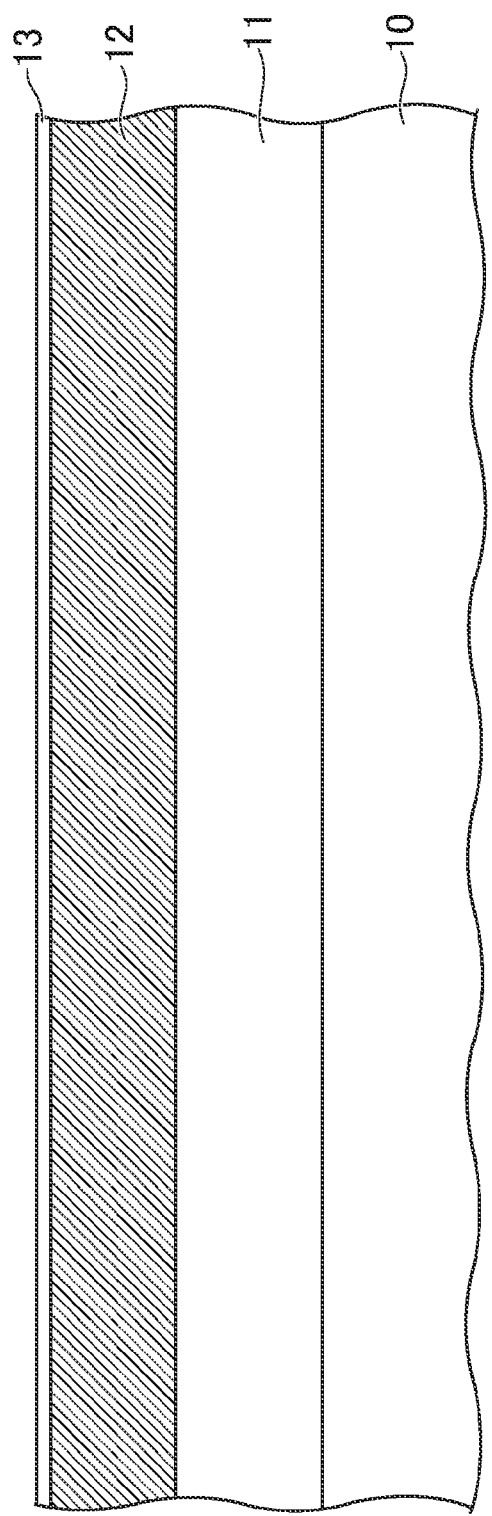
FIG. 4 is an illustration of a step in a method of manufacturing the semiconductor light receiving device according to the embodiment of the present invention.

A method of manufacturing the semiconductor light receiving device 1 according to this embodiment is described below. FIG. 4 to FIG. 9 are illustrations of steps in the method of manufacturing the semiconductor light receiving device 1 according to this embodiment. Cross sections illustrated in FIG. 4 to FIG. 9 correspond to the cross section taken along the line II-II of FIG. 1. A semiconductor multilayer including the n-type InP contact layer 11 (having a thickness of 1 μm), the InGaAs light-absorbing layer 12 (having a thickness of 1 μm), and the p-type InGaAs contact layer 13 (having a thickness of 0.05 μm) are laminated on the Fe-doped InP substrate 10 (wafer) by metal organic chemical vapor deposition (FIG. 4).

Figure 5:
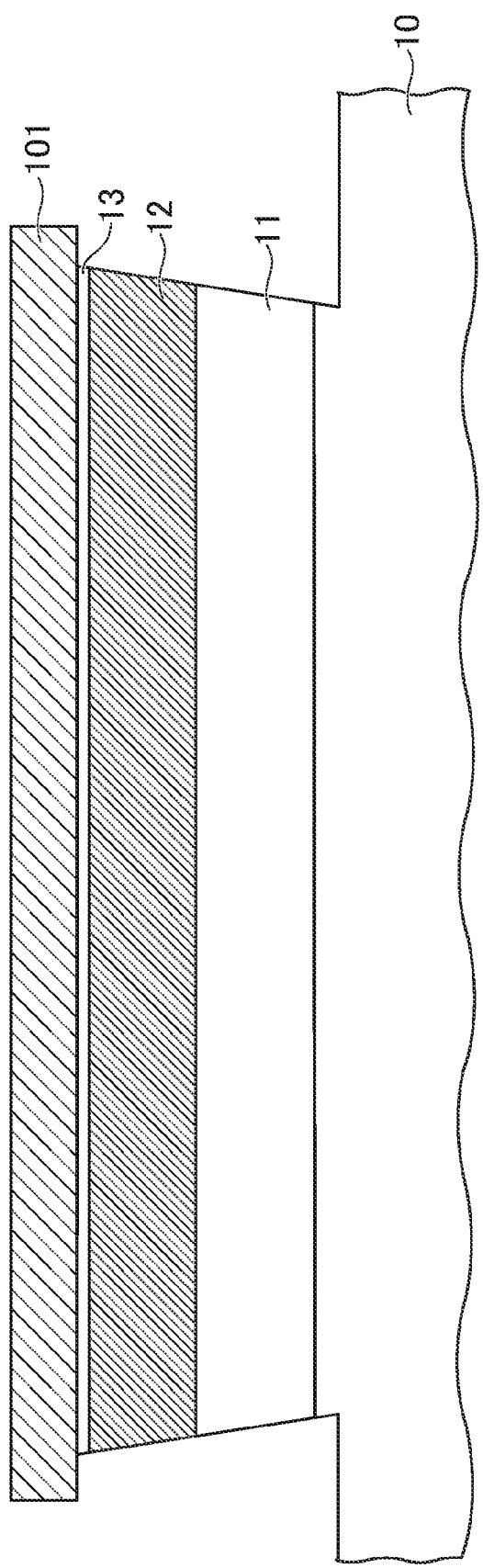
FIG. 5 is an illustration of a step in the method of manufacturing the semiconductor light receiving device according to the embodiment of the present invention.

A mesa mask 101 is formed on an upper surface of the semiconductor multilayer. The mesa mask 101 is an etching mask formed of SiO$_2$, and has a circular shape. Etching is performed with the mesa mask 101 using a Br-based etchant to form an outside mesa (FIG. 5). When the etching is performed, the Br-based etchant enters under the mesa mask 101 to remove the semiconductor multilayer. Thus, a shape of an upper surface of the outside mesa after this step is smaller than that of the mesa mask 101, and a canopy formed of the mesa mask 101 that extends outward from the upper surface of the outside mesa is formed. After that, the mesa mask 101 is removed.

Figure 6:
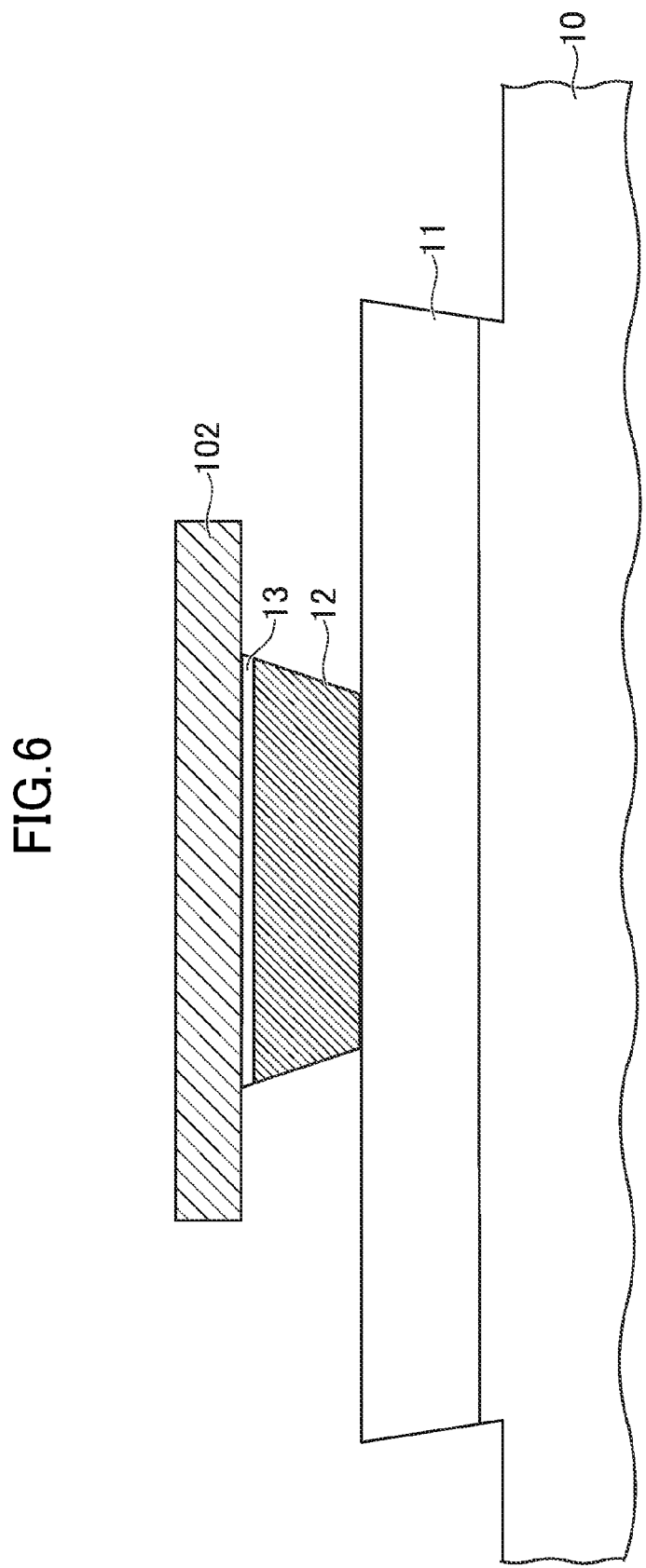
FIG. 6 is an illustration of a step in the method of manufacturing the semiconductor light receiving device according to the embodiment of the present invention.

A mesa mask 102 (first mask) is formed on the upper surface of the semiconductor multilayer. As in the case with the mesa mask 101, the mesa mask 102 is an etching mask formed of SiO$_2$, and has a circular shape. The circular shape of the mesa mask 102 is smaller than the circular shape of the mesa mask 101 (smaller in diameter). Etching is performed with the mesa mask 102 (first mask) using a phosphoric acid-based etchant to form an inside mesa (first mesa) (first etching step: FIG. 6). In the first etching step, the etching is stopped at an upper surface of the n-type InP contact layer 11. A shape of an upper surface of the inside mesa after the first etching step is smaller than the shape of the mesa mask 102 (first mask), and a canopy formed of the mesa mask 102 that extends outward from the upper surface of the inside mesa is formed.

As illustrated in FIG. 6, a cross section of the inside mesa (first mesa) formed in the first etching step has a reversely tapered shape. Specifically, the inside mesa has a width that increases from the n-type InP contact layer 11 side along the lamination direction. Note that, due to a crystal plane formed in the etching step, the inside mesa has a forwardly tapered shape in a cross section that includes the lamination direction and that is orthogonal to this cross section (cross section illustrated in FIG. 3).

Figure 7:
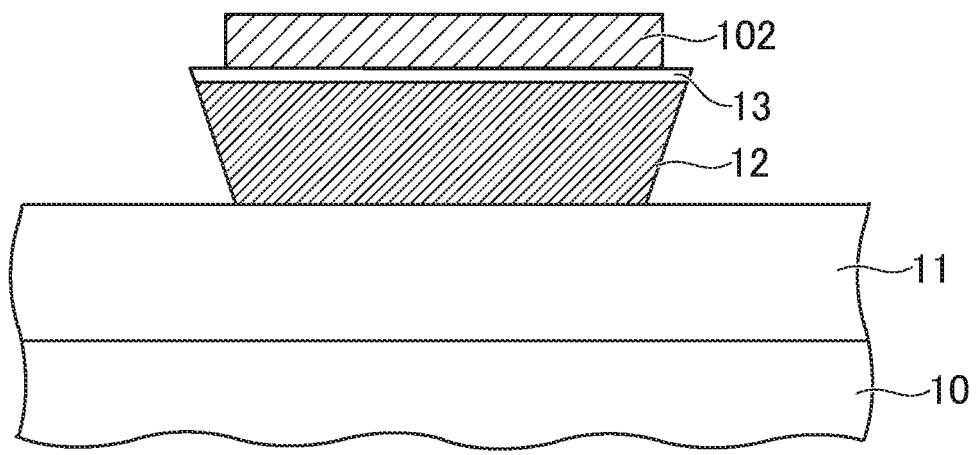
FIG. 7 is an illustration of a step in the method of manufacturing the semiconductor light receiving device according to the embodiment of the present invention.

Through etching the mesa mask 102 (first mask) formed on the upper surface of the semiconductor multilayer using a hydrofluoric acid-based etchant, a mesa mask 102 (second mask) is formed (second mask forming step: FIG. 7). The mesa mask 102 (second mask) after the second mask forming step has a circular shape, and the shape of the mesa mask 102 (second mask) is smaller than the shape of the mesa mask 102 (first mask) before the second mask forming step (smaller in diameter). The shape of the mesa mask 102 (second mask) depends on the etchant and an etching time period, and it is desired that the shape be equal to or smaller than the shape of the upper surface of the inside mesa (first mesa) (upper surface of the p-type InGaAs contact layer 13). In other words, it is desired that the canopy formed of the mesa mask 102 before the second mask forming step be removed.

Figure 8:
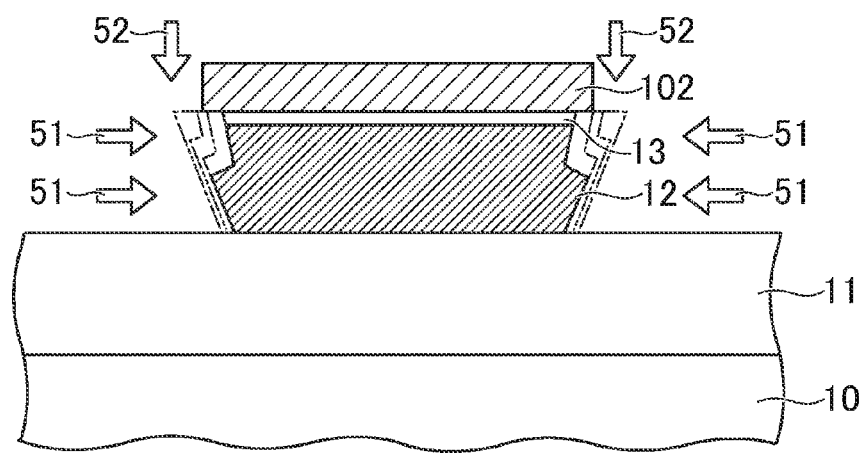
FIG. 8 is an illustration of a step in the method of manufacturing the semiconductor light receiving device according to the embodiment of the present invention.

Side surfaces of the first mesa are etched using the mesa mask 102 (second mask) to remove at least part of an upper portion of the inside mesa to form the light receiving mesa structure (second mesa) (second etching step: FIG. 8). In the second etching step, edge portions of the upper portion of the inside mesa are removed to form the light receiving mesa structure (second mesa). As a result, as illustrated in FIG. 8, the cross section of the light receiving mesa structure has a reversely tapered portion, a forwardly tapered portion, and a reversely tapered portion in this order from the n-type InP contact layer 11 side along the lamination direction.

The plurality of two-dot chain lines in FIG. 8 indicate a process of gradually removing part of the semiconductor multilayer illustrated in FIG. 7 to form the semiconductor multilayer shaped as illustrated in FIG. 8 in the second etching step. As illustrated in FIG. 8, according to this embodiment, the shape of the mesa mask 102 (second mask)

is smaller than the shape of the upper surface of the first mesa (upper surface of the p-type InGaAs contact layer 13) and no canopy is formed of the mesa mask 102. In this case, regions to be edges of the upper surface of the first mesa (upper surface of the p-type InGaAs contact layer 13) are exposed. Therefore, in the second etching step, when the side surfaces of the first mesa are gradually removed (arrows 51), the regions to be the edges of the upper surface are gradually removed as well. The regions to be the edges of the upper surface of the first mesa are gradually removed downward from an upper side as well (arrows 52). An upper portion of the first mesa is removed more than a lower portion thereof, and thus, as illustrated in FIG. 8, the second mesa (light receiving mesa structure) has a cross section that is shaped to have a plurality of stair-steps. As the shape of the mesa mask 102 becomes smaller compared with the shape of the upper surface of the first mesa, the effect becomes greater. However, even when the shape of the mesa mask 102 is equal to the shape of the upper surface of the first mesa, the effect that the upper portion of the first mesa is removed more than the lower portion thereof is still provided.

Figure 9:
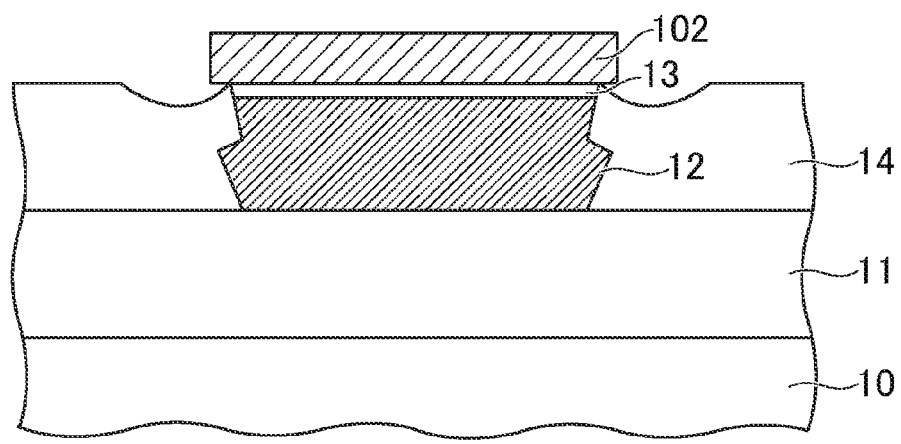
FIG. 9 is an illustration of a step in the method of manufacturing the semiconductor light receiving device according to the embodiment of the present invention.

Burying growth of the Fe-doped InP buried layer 14 is performed so as to surround the light receiving mesa structure using the mesa mask 102 (second mask) by metal organic vapor phase epitaxy (burying growth step: FIG. 9). The p-type InGaAs light-absorbing layer 12 of the light receiving mesa structure includes a pn junction, and the side surfaces of the light receiving mesa structure are buried by the Fe-doped InP buried layer 14 with stability.

After the burying growth step, the mesa mask 102 is removed using a hydrofluoric acid-based etchant. An etching mask formed of $SiO_2$ is formed on an entire surface of the wafer and a portion of the etching mask in a region to be the opening for the n-side electrode 4 is removed (the region is exposed). The Fe-doped InP buried layer 14 is etched using a hydrochloric acid-based etchant and a portion of the Fe-doped InP buried layer 14 is removed to expose the n-type InP contact layer 11. After that, the etching mask is removed.

Then, the protective film 2 formed of a material such as $SiO_2$ is formed on the entire surface of the wafer to cover the surface with the protective film 2. The protective film 2 is processed by photolithography so that portions of the protective film 2 that are in a region of part of the upper surface of the p-type InGaAs contact layer 13 and in a region of part of the upper surface of the n-type InP contact layer 11 are removed to expose the regions. Openings (through holes) in the protective film 2 are formed in those regions. The p-side electrode 3 is formed into a predetermined shape so as to be in contact with the p-type InGaAs contact layer 13, and the n-side electrode 4 is formed into a predetermined shape so as to be in contact with the n-type InP contact layer 11.

After that, an antireflection film (not shown) formed of a material such as SiN is formed on a back surface of the Fe-doped InP substrate 10 (lower surface in FIG. 2 and FIG. 3), and the wafer is completed. The wafer is divided into devices each including a pair of the p-side electrode 3 and the n-side electrode 4 to complete the semiconductor light receiving device 1 according to this embodiment.

Figure 10:
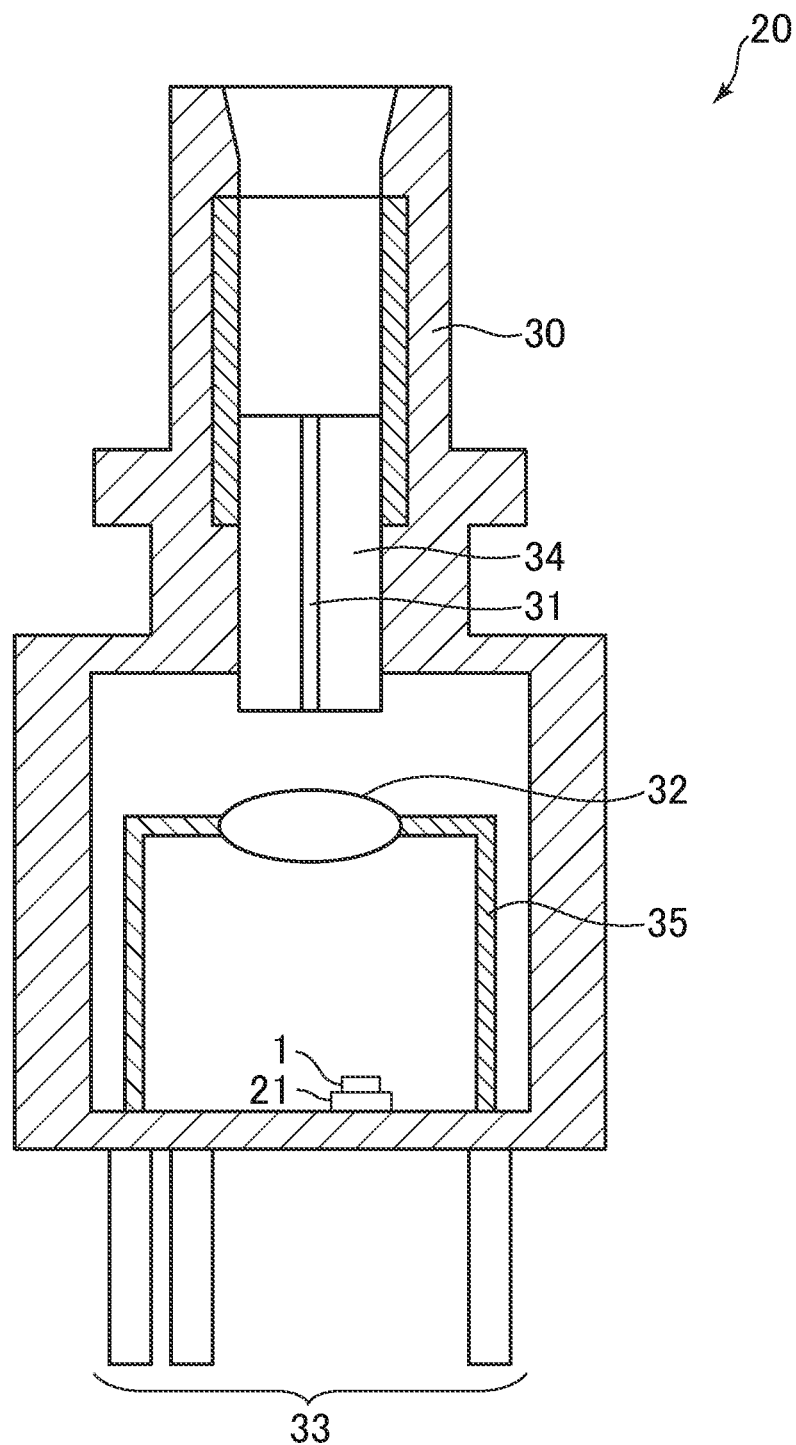
FIG. 10 is a schematic sectional view for illustrating a structure of an optical receiver module according to the embodiment of the present invention.

FIG. 10 is a schematic sectional view for illustrating a structure of an optical receiver module 20 according to this embodiment. The optical receiver module 20 according to this embodiment is an optical receiver module having a bit rate of 25 Gb/s or higher, and includes the semiconductor light receiving device 1 according to this embodiment and a submount 21. The optical receiver module 20 according to this embodiment further includes an entire component housing portion 30, an optical fiber 31 configured to pass light from the outside therethrough, a lens 32 configured to introduce light passing through the optical fiber 31 into the semiconductor light receiving device 1, and lead pins 33 configured to output a signal generated through optoelectronic conversion by the semiconductor light receiving device 1.

The entire component housing portion 30 is a member formed of a metal, which is configured to house members of the optical receiver module 20. The entire component housing portion 30 includes an optical fiber housing portion 34 and a lens housing portion 35. The optical fiber housing portion 34 is a cylindrical member formed of a metal, which is configured to house the optical fiber 31. The optical fiber 31 with a connector is inserted into the optical fiber housing portion 34 from the outside. The lens 32 is fit into a hole formed in a predetermined location of the lens housing portion 35, and the lens housing portion 35 supports the lens 32.

The submount 21 formed of aluminum nitride or the like is mounted on a bottom surface (surface to which the lead pins 33 are connected) of the entire component housing portion 30 on an inner side thereof at a location offset from a central axis. The semiconductor light receiving device 1 according to this embodiment is mounted on the submount 21 so as to receive light passing through the optical fiber 31 and the lens 32. Note that, although not specifically illustrated, a device such as a preamplifier is mounted on the bottom surface of the entire component housing portion 30 on the inner side thereof. The mounted device, the submount 21, and the semiconductor light receiving device 1 are electrically connected to a flexible substrate (not shown) existing outer side the optical receiver module 20 via the lead pins 33. The lead pins 33 are connected from the outer side of the bottom surface of the entire component housing portion 30. An electric signal that is output from the semiconductor light receiving device 1 or the mounted device is transmitted to the flexible substrate via the lead pins 33.

The submount 21 is formed of a material such as aluminum nitride, and the semiconductor light receiving device 1 is mounted on the submount 21. The semiconductor light receiving device 1 includes the p-side electrode 3 and the n-side electrode 4 on the submount 21 side. The submount 21 includes, together with a high-frequency signal line, a P electrode pattern and an N electrode pattern on the semiconductor light receiving device 1 side. An AuSn solder vapor deposition pattern corresponding to the shape (junction) of the p-side electrode 3 of the semiconductor light receiving device 1 is formed at one end of the P electrode pattern, and an AuSn solder vapor deposition pattern corresponding to the shape of the n-side electrode 4 of the semiconductor light receiving device 1 is formed at one end of the N electrode pattern. Through application of appropriate load and heat, and through solder connection of the two electrodes at the same time, the optical receiver module is completed. Through electrically connecting the P electrode pattern and the N electrode pattern of the submount 21 to the p-side electrode 3 and the n-side electrode 4, respectively, of the semiconductor light receiving device 1, the semiconductor light receiving device 1 according to this embodiment can satisfactorily realize both electrical connection and physical connection to the submount 21.

A result of evaluation of the semiconductor light receiving device 1 according to this embodiment is as follows. Even when the semiconductor light receiving device 1 is driven with a reverse bias voltage of 2 V or lower, a high light receiving sensitivity of 0.9 A/W or higher and high speed operation are possible, and the semiconductor light receiving device 1 is applicable to an optical receiver module having a bit rate of 25 Gb/s or higher. In the semiconductor light receiving device 1 according to this embodiment, the side surface of the light-absorbing layer to be the pn junction is buried by the buried layer formed of a semi-insulating semiconductor with stability. Thus, a dark current characteristic thereof is 10 nA or less, which is sufficiently low, and a high temperature energization test reveals that high reliability lasting 20 years or more can be obtained.

Note that, according to this embodiment, through etching the first mask in the second mask forming step, the second mask is formed. The second mask forming step according to this embodiment is desired because, through control of the etchant and the etching time period, a center of the first mask and a center of the second mask can be aligned when the second mask is formed. However, the present invention is not limited thereto, and the first mask may be removed and a second mask in a desired shape may be newly formed.

Figure 11:
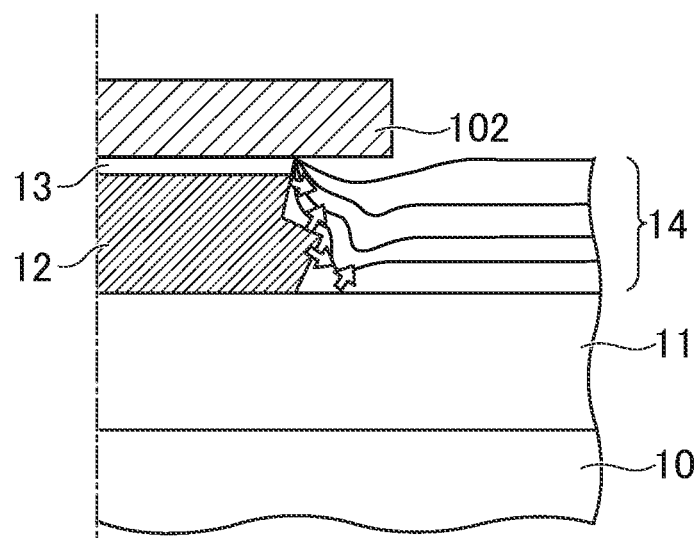
FIG. 11 is an illustration of formation of a buried layer in a burying growth step according to the embodiment of the present invention.
Figure 12:
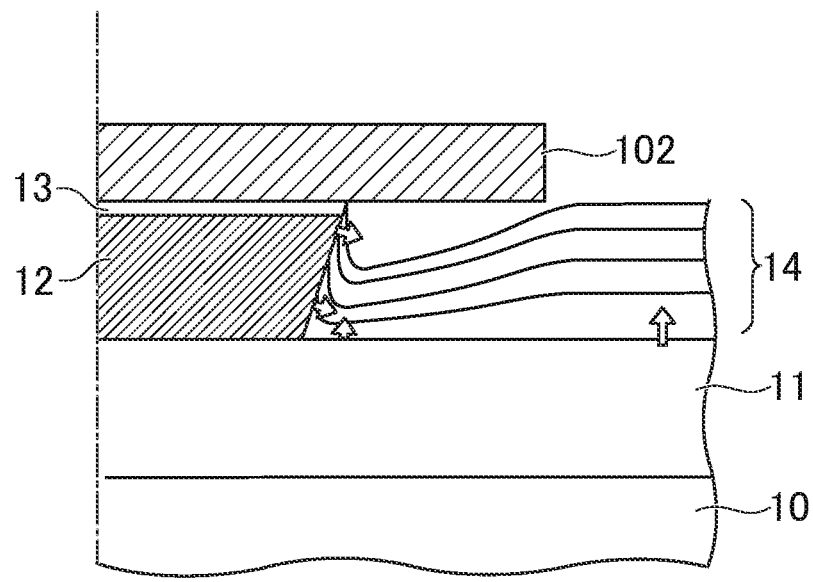
FIG. 12 is an illustration of formation of a buried layer in a burying growth step of a semiconductor light receiving device according to a first comparative example.

The formation of the Fe-doped InP buried layer 14 in the semiconductor light receiving device 1 according to this embodiment is reviewed below. FIG. 11 is an illustration of the formation of the Fe-doped InP buried layer 14 in the burying growth step according to this embodiment, and FIG. 12 is an illustration of formation of a Fe-doped InP buried layer 14 in a burying growth step of a semiconductor light receiving device according to a first comparative example.

In the semiconductor light receiving device according to the first comparative example, after the first etching step illustrated in FIG. 6, burying growth of the Fe-doped InP buried layer 14 is performed so as to surround the side surfaces of the inside mesa (first mesa) using the mesa mask 102 (first mask) by metal organic vapor phase epitaxy. As illustrated in FIG. 12, a cross section of the inside mesa (first mesa) has a reversely tapered shape. Further, a canopy formed of the mesa mask 102 that extends outward from the upper surface of the inside mesa is formed. Therefore, as indicated by the arrows in FIG. 12, on the upper surface of the n-type InP contact layer 11 (in a region away from the inside mesa), the Fe-doped InP buried layer 14 is formed by orderly laminating the layers along the lamination direction. However, in the vicinity of the inside mesa, the Fe-doped InP buried layer 14 is not formed by laminating the layers with stability on the side surface of the inside mesa and on the upper surface of the n-type InP contact layer 11 (in a region in the vicinity of the inside mesa). As a result, a recess is formed in the Fe-doped InP buried layer 14 in the vicinity of the upper surface of the inside mesa, and the side surface of the inside mesa is not buried by the Fe-doped InP buried layer 14 with stability. This deteriorates characteristics of the semiconductor light receiving device according to the first comparative example.

In a semiconductor light receiving device (not shown) according to a second comparative example, the mesa mask 102 (second mask) after the second mask forming step illustrated in FIG. 7 is used, and burying growth of the Fe-doped InP buried layer 14 is performed so as to surround the inside mesa (first mesa) by metal organic vapor phase epitaxy. Even in such a case, an inconvenience is incurred such as a bulge of the Fe-doped InP buried layer 14 formed so as to protrude toward an upper end of the inside mesa or burying growth of the Fe-doped InP buried layer 14 so as to surround the mesa mask 102 as well.

On the other hand, in the semiconductor light receiving device 1 according to this embodiment, the light receiving mesa structure has a cross section that is shaped to have a plurality of stair-steps. As a result, as indicated by the arrows in FIG. 11, the Fe-doped InP buried layer 14 is formed by laminating the layers with stability not only on the upper surface of the n-type InP contact layer 11 (in the region away from the inside mesa) but also in the vicinity of the light receiving mesa structure. Therefore, as illustrated in FIG. 9, there is still a possibility that a small recess is formed in the upper surface of the Fe-doped InP buried layer 14 in the vicinity of the upper surface of the light receiving mesa structure, but the Fe-doped InP buried layer 14 is formed with stability so as to cover the side surfaces of the light receiving mesa structure. Thus, characteristics of the semiconductor light receiving device 1 according to this embodiment are improved.

The semiconductor light receiving device, the optical receiver module, and the manufacturing methods thereof according to the embodiment of the present invention are described above. The semiconductor light receiving device according to the present invention is not limited to a photodiode. The present invention can be applied to other semiconductor light receiving devices such as an avalanche photodiode when the device has a mesa structure including layers formed of a common material. Further, the method of manufacturing the semiconductor light receiving device according to the present invention is not limited to the manufacturing method according to the embodiment described above, and the present invention is widely applicable.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor light receiving device, comprising:
   a substrate, formed of InP;
   a first contact layer, formed of InP, formed on the substrate;
   a mesa structure formed on the first contact layer, the mesa structure including an absorbing layer and a second contact layer, which both are formed of InGaAs, and the mesa structure having a cross section including a first reversely tapered portion, a forwardly tapered portion on the first reversely tapered portion, and a second reversely tapered portion on the forwardly tapered portion; and
   a buried layer, formed of impurity doped InP so as to be semi-insulating and configured to bury therein the mesa structure so as to surround side surfaces of the mesa structure.

2. An optical receiver module, comprising:
   a semiconductor light receiving device including:
      a substrate, formed of InP;
      a first contact layer, formed of InP, formed on the substrate;
      a mesa structure formed on the first contact layer, the mesa structure including an absorbing layer and a second contact layer, which both are formed of InGaAs, and the mesa structure having a cross section including a first reversely tapered portion, a forwardly tapered portion on the first reversely tapered portion, and a second reversely tapered portion on the forwardly tapered portion; and a buried layer, formed of impurity doped InP so as to be semi-insulating and being configured to bury therein the mesa structure so as to surround side surfaces of the mesa structure; and a submount for mounting thereon the semiconductor light receiving device, wherein the semiconductor light receiving device includes thereon a p-side electrode and an n-side electrode on the submount side, wherein the submount includes thereon a P electrode pattern and an N electrode pattern on the semiconductor light receiving device side, and wherein the p-side electrode is electrically connected to the P electrode pattern and the n-side electrode is electrically connected to the N electrode pattern.

3. A method of manufacturing a semiconductor light receiving device, comprising:

forming a first mask on an upper surface of a semiconductor multilayer, and performing etching of the semiconductor multilayer using the first mask to form a first mesa;

forming a second mask on the upper surface of the semiconductor multilayer, the second mask having a shape smaller than a shape of the first mask;

etching side surfaces of the first mesa using the second mask to form a second mesa, the second mesa having a cross section including a first reversely tapered portion, a forwardly tapered portion on the first reversely tapered portion, and a second reversely tapered portion on the forwardly tapered portion; and performing burying growth of a buried layer using the second mask so that the buried layer surrounds side surface of the second mesa, the buried layer being formed of impurity doped InP so as to be semi-insulating, wherein the second mesa defines a mesa structure including an absorbing layer and a contact layer which both are formed of InGaAs.

4. The method of manufacturing a semiconductor light receiving device according to claim 3, wherein the forming the second mask comprises etching the first mask to form the second mask.

5. The method of manufacturing a semiconductor light receiving device according to claim 4, wherein the shape of the second mask formed in the forming the second mask is smaller than the shape of the first mask.

6. The method of manufacturing a semiconductor light receiving device according to claim 3, wherein the shape of the second mask formed in the forming the second mask is equal to or smaller than a shape of an upper surface of the first mesa formed in the first etching step.

7. The semiconductor light receiving device according to claim wherein the second contact layer is formed on the absorbing layer in the mesa structure.

8. The semiconductor light receiving device according to claim 7, further comprising:

a protective film being formed on the second contact layer and the buried layer.

9. The optical receiver module according to claim 2, wherein the second contact layer in the semiconductor light receiving device is formed on the absorbing layer in the mesa structure.

10. The optical receiver module according to claim 9, wherein the semiconductor light receiving device further includes a protective film being formed on the second contact layer and the buried layer.

11. The method of manufacturing a semiconductor light receiving device according to claim 3, wherein the second contact layer is formed on the absorbing layer in the mesa structure.

12. The method of manufacturing a semiconductor light receiving device according to claim 11, further comprising:

a protective film forming step of forming a protective film on the contact layer and the buried layer.

13. The semiconductor light receiving device according to claim 1, wherein the second contact layer is doped with an impurity.

14. The optical receiver module according to claim 2, wherein the second contact layer is doped with an impurity.

15. The method of manufacturing a semiconductor light receiving device according to claim 3, wherein the second contact layer is doped with an impurity.

16. The semiconductor light receiving device according to claim 1, wherein the absorbing layer of the mesa structure includes the cross section including the first reversely tapered portion, the forwardly tapered portion on the first reversely tapered portion, and the second reversely tapered portion on the forwardly tapered portion.

17. The semiconductor light receiving device according to claim 16, wherein the second contact layer of the mesa structure is included in the second reversely tapered portion.

* * * * *